LOW DISTORTION AUDIO OSCILLATOR
Filed Jan. 21, 1966
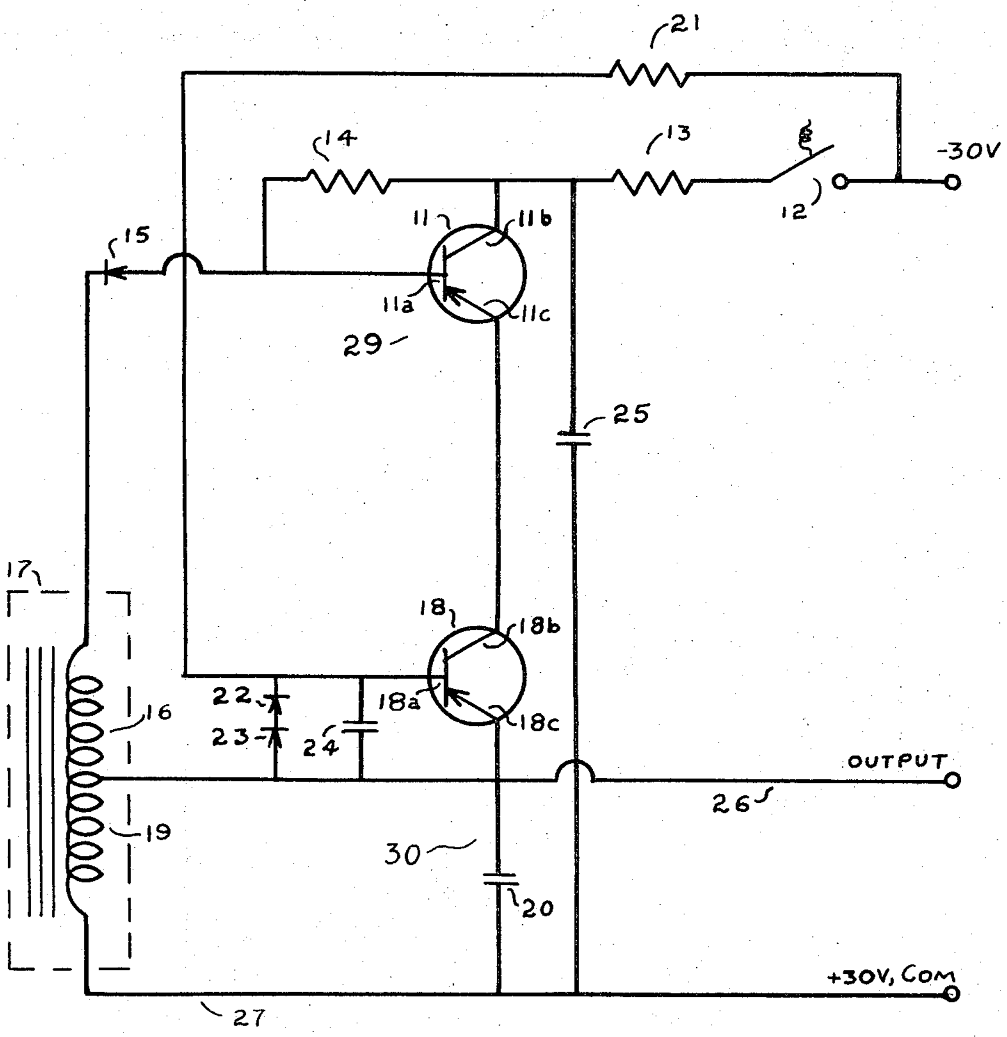
INVENTORS
RALPH E. ALLISON &
VERNON CANNON
BY
William B. Walter
AGENT United States Patent Office
3,368,165
Patented Feb. 6, 1968

3,368,165
LOW DISTORTION AUDIO OSCILLATOR

Ralph E. Allison, 451 Awa St., Hilo, Hawaii 96720, and Vernon Cannon, 6033 McNees Ave., Whittier, Calif. 90606

Filed Jan. 21, 1966, Ser. No. 524,652
4 Claims. (Cl. 331—117)

ABSTRACT OF THE DISCLOSURE

A common base transistor is used to isolate the emitter follower oscillator transistor from the LC resonant circuit and improve the resonant Q and reduce distortion in an audio oscillator. Compatible diodes are used to control the bias voltage on the common base transistor to give temperature stability.

The present invention relates generally to transistorized oscillators and more particularly to transistorized oscillators for use in audiometers or hearing test equipment.

Several special requirements must be met in oscillators designed for use as a tone source in an audiometer. First, the distortion must be low, not more than 1% distortion is permissible. Since audiometers are normally portable equipment, it is very desirable that the oscillator be highly efficient in the use of power. This makes transistors very desirable. The oscillator output must be stable in frequency over a reasonable range of temperature and power supply voltage since the audiometer may be supplied with power from batteries. The audiometer tone must be pulsed with a rise time in the order of .05 second. The decay time when the oscillator is turned off should be in the same order of time and there must be little or no change in frequency, either during the time that the tone is rising from minimum value to the normal value or when the tone is decaying from a normal value to an inaudible value. In order to meet this requirement the oscillator must start operating at very low supply voltage and the frequency must be stable from this low supply voltage to normal operating voltage. For audiometer use the oscillator should be easily tuneable in discreet steps from at 125 cycles per second to 8000 cycles per second.

An object of the present invention is to provide a low distortion transistorized oscillator adjustable in discreet steps between 125 and 8000 cycles per second.

Another object of this invention is to provide an oscillator having good pulsing characteristics, that is, one in which the signal or tone may be built up slowly and caused to decay slowly with a negligible change in frequency during the time the level is changing.

Another object of this invention is to design a very stable oscillator, stable not only with changes in voltage from the supply, but also frequency stable with the temperatures normally met in test environments where hearing tests are made.

Basically, this oscillator is a tuned LC transistor emitter follower oscillator in which the output is fed back into the base of the transistor to obtain oscillation. The frequency is changed by changing the inductance of the tuned circuit by means of taps on the coils and changing the capacitor in the tuned circuit by switching to a different capacitance value for the various frequencies. The basic amplifier consists of transistor 11 which is an emitter follower stage coupled into LC resonant circuit 28 through a transistor 18 which has a high A.C. impedance and isolates the resonant circuit from the low impedance emitter follower circuit 29. In this way, the loading effect across the tuned circuit 30 is maintained at a minimum. The fact that the feedback coil 16 is coupled into the base of the emitter follower stage 11 results in this coil being fed into a high impedance giving a minimum loading effect on this coil also.

The above and still further objects, features, and advantages of the present invention will become apparent upon consideration of the following detailed description of one specific embodiment thereof especially when taken in conjunction with the accompanying drawing, wherein the single figure is a schematic illustration of a preferred embodiment of the present invention.

The figure is drawn showing the use of PNP transistors. However, it will be appreciated that the same circuits may be utilized in conjunction with NPN transistors if supply polarity is reversed. The oscillator comprises a transistor 11 having a base 11*a*, a collector 11*b* and an emitter 11*c*. The negative potential of 30 volts is supplied through the pulsing switch 12, the series resistor 13, to the collector 11*b*. A voltage dividing network consisting of resistor 14 and diode 15 determine the bias on the base 11*a* of transistor 11. The base circuit of transistor 11 is completed through the feedback coil 16 on the output transformer 17.

A transistor 18, consisting of a base 18*a*, a collector 18*b* and an emitter 18*c* is connected between the emitter 11*c* and winding 19 on the output transformer 17. The winding 19 is connected in parallel with capacitor 20 to determine the frequency of oscillation. The base circuit on transistor 18 is biased by the voltage dividing network consisting of resistor 21 connected to —30 volt supply and the diodes 22 and 23 connected to the common circuit connecting of the feedback coil 16 and the emitter 18*c* of transistor 18. The capacitor 24 bypasses the diodes 22 and 23 to maintain a very low A.C. impedance between the base and emitter of transitsor 18. A previously referred to resistor 13 and the capacitor 25 determine time constant for the buildup and decay of the oscillations of transistor 11.

Diode 15 stabilizes the operation of transistor 11 with temperature change and diodes 22 and 23 equalize the operation of transistor 18 with temperature change. Winding 19 on output transformer 17 completes the circuit from the emitter 18*c* of transistor 18 to the plus side of the power source through lead 27.

The output signal of the oscillator is available from lead 26 with lead 27 as the common lead.

The output signal is raised in voltage by the feedback winding 16 on output transformer 17 and applied to base 11*a*. This increased voltage is necessary to make up for the voltage loss in the emitter follower amplifier stage, transistor 11.

Previously, some oscillator circuits have used an emitter follower with the output coil. In the emitter circuit the resonant circuit was isolated from the emitter by use of a series resistor between the emitter and the resonant circuit. This resistor has to be of a comparatively low value to make possible the required gain to cause oscillation in the circuit. With a low resistance value here, it is very difficult to reduce the distortion in the circuit to less than 2 or 3%. By replacing this resistor between the emitter and the resonant circuit with an additional transistor as shown in the drawing, the D.C. resistance in the circuit can be kept low so that normal D.C. current will flow through the emitter follower amplifier stage. At the same time, A.C. impedance between the emitter and the resonant circuit will be high with the resultant marked improvement in the pureness of tone obtained from the oscillator. It is quite feasible to obtain a tone with less than 1/10% distortion in the output. It is this improvement which involves the use of an extra transistor to replace the resistor which normally might be used with is the new feature in this invention.

What is claimed is:

1. A transistor oscillator, designed to generate very low distortion sine waves, comprising a transistor having a base, a collector and an emitter, a source of direct current potential having a pair of terminals, means connecting the collector to one of the terminals, means including an LC parallel resonant circuit having a feedback winding coupled to it, and connected in series aiding fashion to it, and a second transistor having a base, a collector and an emitter, means of connecting the emitter of the first mentioned transistor through the collector-emitter circuit of the second transistor and through the LC parallel resonant circuit to the other terminal, and also through the feedback winding to the base of the first transistor, means of applying a small bias from the first terminal to the base of the first transistor, means of applying a small bias from the first terminal to the base of the second transistor, means including a diode connected between the base and emitter of the second transistor.

2. An oscillator circuit including in combination two transistors each having a base, an emitter and a collector, a point of D.C. potential with reference to a common point, a first resistor means connecting the base of the first transistor to the point of D.C. potential, a second resistor means connecting the base of the second transistor to the point of D.C. potential, a circuit for connecting the collector of the first transistor to the point of D.C. potential, a circuit for connecting the emitter of the first transistor to the collector of the second transistor, a parallel resonant tuned circuit having a first and a second terminal, with a feedback coil connected to said first terminal, with said first terminal being connected to the emitter of said second transistor and to the base of the said first transistor through said feedback coil and a diode, and a diode connected between the base and the emitter of said second transistor and a circuit connecting the second terminal on the parallel resonant circuit to the common point.

3. A sine wave transistor oscillator substantially independent of change in voltage and ambient temperature comprising two PNP transistors each having a base, an emitter, and a collector and an inductor capacitor parallel resonant circuit with a feedback coil coupled to the inductor and series aiding connected to the inductor, and a source of negative unidirectional potential, means for connecting the collector of the first transistor to said source, means for connecting the emitter of the first transistor to the collector of the second transistor, means of connecting the emitter of said second transistor through the inductor capacitor parallel resonant circuit to a point of reference potential, means of applying a small bias from the source of unidirectional potential through a resistor the base of the first transistor, means of applying a small bias from the source of unidirectional potential through a resistor to the base of the second transistor, means including a diode and a capacitor connected between the base and emitter of the second transistor, means to feedback the signal from the inductor capacitor parallel resonant circuit through the feedback coil to the base of the first transistor.

4. A sine wave transistor oscillator substantially independent of changes in voltage and ambient temperature comprising two PNP transistors, each having a base, an emitter and a collector, and an inductor capacitor parallel resonant circuit with a feedback coil coupled to the inductor and series aiding connected to the inductor, and a source of negative unidirectional potential, means for connecting the collector of the first transistor to such source, means for connecting the emitter of the first transistor to the collector of the second transistor, means of connecting the emitter of the second transistor through the inductor capacitor parallel resonant circuit to the point of reference potential, and, through the feedback coil, to the base of the first transistor, means of applying a small bias from the source of unidirectional potential through a resistor to the base of the first transistor, means of applying a small bias from the source of unidirectional potential through a resistor to the base of the second transistor, means, including a diode an a capacitor, connected between the base and emitter of the second transistor to maintain the base of the second transistor at approximately the same A.C. potential as the emitter of the second transistor, means to feed back the signal from the inductor capacitor parallel resonant circuit through the feedback coil to the base of the first transistor.

References Cited

UNITED STATES PATENTS 3,003,120 10/1961 Greefkes ____________ 331—117

JOHN KOMINSKI, *Primary Examiner.*

ROY LAKE, *Examiner.*